United States Patent [19]
Thompson

[11] Patent Number: 6,121,218
[45] Date of Patent: Sep. 19, 2000

[54] PRIMING COMPOSITION FOR BONDING PHOTORESISTS ON SUBSTRATES

[76] Inventor: Andrew Michael Thompson, 409 Mercer St., Ridgway, Pa. 15853

[21] Appl. No.: 08/968,304

[22] Filed: Nov. 12, 1997

[51] Int. Cl.[7] .................................. C11D 3/44; C11D 7/50
[52] U.S. Cl. ......................... 510/176; 510/175; 510/178; 510/499; 510/506
[58] Field of Search ...................................... 430/192, 193, 430/191, 165; 510/365, 417, 424, 506, 238, 505, 434, 407, 501, 175, 176, 178, 499; 134/40, 38

[56] References Cited

U.S. PATENT DOCUMENTS

| | | | |
|---|---|---|---|
| 5,082,584 | 1/1992 | Loth et al. | 252/122 |
| 5,393,468 | 2/1995 | Erilli et al. | 252/550 |
| 5,830,836 | 11/1998 | Smith et al. | 510/212 |

*Primary Examiner*—Yogendra Gupta
*Assistant Examiner*—Gregory Webb
*Attorney, Agent, or Firm*—Pillsbury Madison & Sutro LLP

[57] ABSTRACT

A priming concentrate composition is provided that functions both as a cleaning and adhesive promoting composition for cleaning a substrate and for bonding a subsequently applied photoresist to the substrate. The concentrate composition contains, as essential components, (a) an alcohol, (b) an alcohol ether, (c) an organic or poly acid and (d) a urea or thiourea-containing compound or derivative or analogue thereof or other compound of heteroatoms with the balance being water. The priming composition can be applied to a stationary or moving substrate, as a concentrate or further diluted with an aqueous medium, by brushing, spraying or immersing and the like.

18 Claims, 1 Drawing Sheet

Minutes, Ultrasonic Agitation, DI Water, 50°C

Over-etched surface occurring as a result of photoresist delamination and subsequent exposure to HF

PRIMING COMPOSITION FOR BONDING PHOTORESISTS ON SUBSTRATES

BACKGROUND OF THE INVENTION

This invention relates to priming compositions for use in cleaning substrates and promoting adhesion of photoresists to various substrates, articles of manufacture thereof, and methods of treating substrates and bonding photoresists to the treated substrates.

FIELD OF THE INVENTION

The coating of various substrates with either positive-type photoresists (photochemical degradation) or negative-type photoresists photochemical crosslinking) is known in the manufacture of microelectronic components, for example compact discs and semiconductors. It is also known in this industry to use primers to treat the substrates in an effort to improve adhesion between a subsequently applied layer of photoresist and the substrate. Improvement in adhesion is often referred to as reduced jitter, improved block error rate, and prevention of delamination and undercutting. There is a continuing effort in this area of the art to provide improved priming compositions that function as complete cleaning and adhesion promoting agents formulated for use with positive and negative photoresist on substrates to overcome problems presently associated in the manufacture of microelectronic component.

The present invention is related to a priming composition that eliminates the need for separate wet process cleaning and priming of substrates prior to photoresist application while providing an ultra clean substrate with excellent photoresist adhesion characteristics. The priming composition of the invention accomplishes this dual task through creating an ionic charge at the matrix interface which repels contaminants while providing a hydrogen bond for the adhesion of subsequently applied photoresists.

Accordingly, an object of the invention is to provide a priming composition that functions as a cleaning and adhesion promoting agent for use with photoresists on substrates.

Another object of the invention is to provide microelectronic components having improved physical and performance properties formed from a photoresist bonded to a substrate by the invention priming composition.

A further object is to provide economical methods of applying the invention priming composition to a substrate prior to coating with a photoresist in a more flexible and efficient manner than presently known.

Other objects, aspects as well as the several advantages of the invention will be apparent to those skilled in the art upon reading the specification and appended claims.

SUMMARY OF THE INVENTION

Broadly, the invention relates to a priming composition useful for cleaning substrates and bonding photoresists on substrates comprising (a) an alcohol, (b) an alcohol ether, (c) an organic acid, poly acid, acid anhydride or acid halide thereof and (d) a urea, thiourea, derivative or analogue thereof or other compound of heteroatoms having at least one non-bonding pair of electrons and a resonance structure that functions to bond to both a substrate and a photoresist.

In another embodiment, the invention relates to microelectronic components comprising a substrate, such as silicon, glass, indium tin oxide, gallium arsenate, and the like, an effective amount of a film of the priming composition of the invention carried on at least one surface of the substrate, and a layer of a negative or positive photoresist bonded to the substrate by the priming composition.

In a further embodiment, the invention relates to a method of a cleaning or cleansing a surface of a substrate and bonding of a photoresist layer subsequently applied to the cleaned surface comprising washing a surface of a substrate chosen from silicon, glass, indium tin oxide and gallium arsenate with an effective amount of the priming composition of the invention sufficient to bind contaminants present thereon, rinsing the washed surface with an aqueous solution sufficient to remove bound contaminants and leave a thin film of priming composition on the cleaned surface, applying a layer of photoresist to the cleaned surface, and curing the layer of photoresist under conditions which cause the film of priming composition to bind both to the substrate and photoresist.

BRIEF DESCRIPTION OF THE DRAWINGS

The accompanying drawings serve to elucidate the principles of this invention. In such drawings.

DETAILED DESCRIPTION OF THE INVENTION

Figure 1:
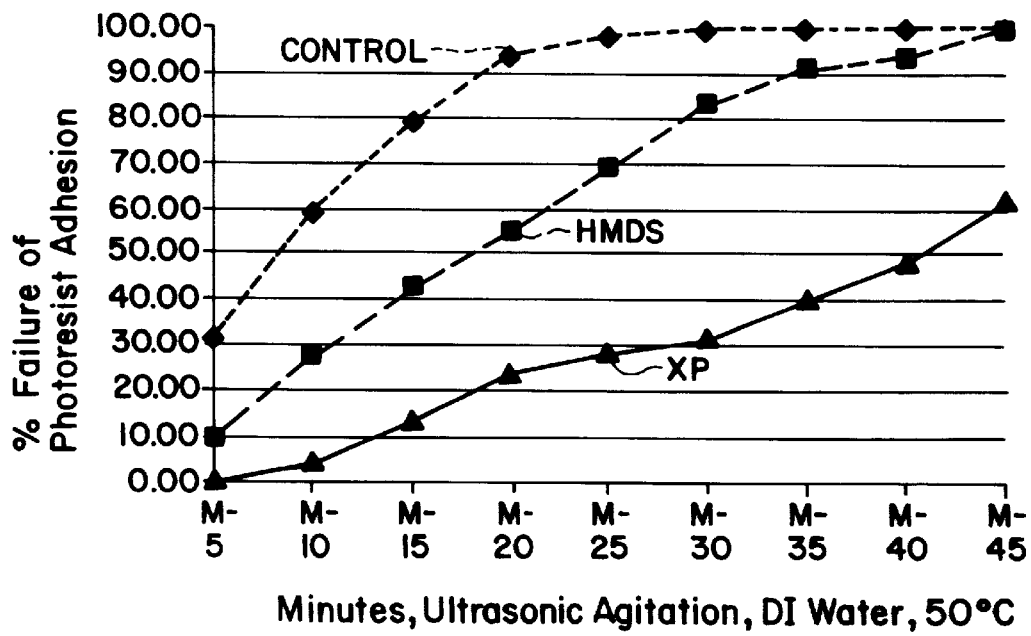
FIG. 1 is graph showing the photoadhesive properties of inventive, comparative, and control examples.

The priming composition of the invention is a complete cleansing and adhesion promoting composition for use with positive and negative photoresist on a substrate. The priming composition of the invention broadly comprises (a) an alcohol, (b) an alcohol ether, (c) an organic acid and (d) a urea or thiourea or derivative thereof Component (a) can comprise any alcohol, polyalcohol, polymeric alcohol or other alcohol equivalent that functions to provide a charge stabilizing water compatible media to the priming composition. Of the above mentioned alcohol compounds, component (a) of the priming composition preferably comprises a polyhydroxy alcohol, more preferably dihydroxy alcohols commonly known as glycols. Typical illustrative examples of suitable glycols include ethylene glycol, propylene glycol, trimethylene glycol, tetramethylene glycol, pentamethylene glycol, and hexamethylene glycol and mixtures thereof. Suitable polyalcohols that can be used include polyvinyl alcohol (EVA) or derivatives thereof. The following structure

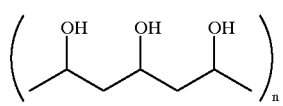

is polyvinyl alcohol (PVA) and "n" typically is 3000 to 50,000 repeating units. Of the above-mentioned alcohols, glycol is presently preferred.

Component (b) of the present priming composition broadly comprises an alcohol ether or polyalkyl ether, especially an alkyl ether of a hydroxy alcohol, such as ethylene glycol. In addition, crown ethers and polyethylene glycols (PEGs) of the formula $HOCH_2CH_2(OCH_2CH_2)_n OH$ where n ranges from 1–9 can also be used. Presently preferred are alkyl ethers of diethylene glycol including monomethyl, ethyl, an n-butyl ether of diethylene glycol and mixtures thereof. These alkyl ethers are commonly known as carbitols. It is also within the scope of the invention to use monoallyl ethers of monoethylene glycol (cellosolves) as illustrated by monomethyl ether of ethylene glycol, monoethyl ether of ethylene glycol and n-butyl ether of ethylene glycol and mixtures thereof as well as mixtures thereof with the alkyl ethers of diethylene glycol.

The following structure 8 is a polyethylene glycol (PEG) and "n" typically is 3000 to 50,000 repeating units.

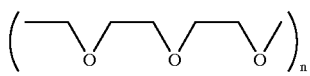

8

The following structure 9 is an example of a cyclic ether or crown ether. There are a large variety of these crown ethers. The following crown ether would be named 24-crown-8 because there are 24 atoms in the ring and 8 oxygen's.

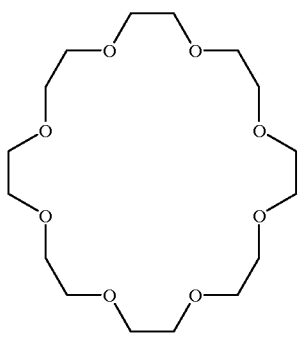

9

It is also within the scope of the invention to use compounds other than the above-mentioned alkyl ethers alone or together with one or more of the above alkyl ethers so long as these compounds have similar charge and solvating characteristic (dielectric constant, pka of the removable protons, etc.) as the alkyl ethers described above.

Component (c) of the present priming composition broadly comprises an organic acid or poly acid or acid anhydride or acid halide thereof. Component (c) preferably comprises a hydroxy-substituted mono- or dicarboxylic organic acid. Representative examples of monocarboxylic hydroxy acids that can be used include glycolic acid, lactic acid, hydroxy butyric or isobutyric acid, hydroxy valeric and isovaleric acid, glyceric acid, and the like, and mixtures thereof.

The structures below are representative acids that can be used.

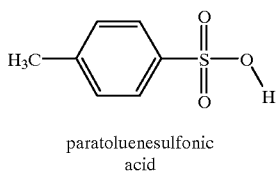

paratoluenesulfonic acid

10

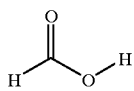

11

-continued

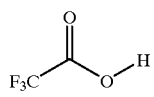

trifuoroacetic acid

12

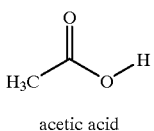

acetic acid

13

If the hydroxyl is replaced with a chlorine, the acid chlorides are formed as shown by structure 14. If a hydroxyl is replaced with another acid, the acid anhydride 15 is obtained.

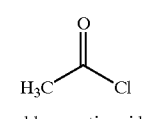

chloroacetic acid

14

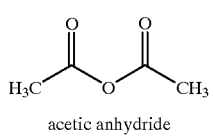

acetic anhydride

15

Representative examples of suitable dicarboxylic hydroxy acids include oxalic, malonic, succinic, glutaric, adipic, suberic, and the like, as well as mixtures thereof. Of the above listed organic acids, glycolic acid and oxalic acid are presently preferred.

Another route to adding organic or poly acids to the priming formulation of the invention without adding the acid directly can be through the addition of the acid anhydride or acid halide, e.g. acid chloride, equivalent of any of the above mentioned acids. Many of these acid equivalents would decompose when added to water or the solvent system under consideration to form the desired acid. It is also designed so that the acid would form only upon heating or mixing of the components so that during shipping the pH of the product should be close to neutrality.

Component (d) broadly comprises urea, thiourea or analogue thereof or other compound of heteroatoms having a resonance structure that functions to bond to both the substrate and photoresist. Component (d) comprises an alkylated derivative of urea and thiourea including monoalkylated and polyalkylated ureas and thioureas and hydroxy derivatives of urea and thiourea including mono-hydroxy and polyhydroxy derivatives. The alkyl substituted ureas are also commonly referred to as imidazolidinones. The alkyl substituents generally are lower alkyl groups having from 1 to 6 carbon atoms. Presently preferred of the alkylated derivatives is ethyl urea (2-imidazolidinone) although ethylene thiourea and other alkylated imidazolines, for example, di and tetra alkylated ureas, and mixtures thereof can be used. Presently preferred hydroxy derivative is bis (hydroxyrnethyl)urea ($C_3H_8N_2O_3$) represented by the formula:

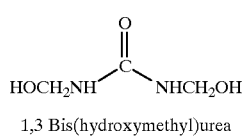

1,3 Bis(hydroxymethyl)urea

Representative structures containing a urea (amine) group which can share in a heteroatom resonance structure include Ammonium Thiocyanate ($CH_4N_2S$), Cyanamide ($CH_2N_2$), Diazomethane ($CH_2N_2$), Formamide ($CH_3NO$), Hydroxyurea ($CH_4N_2O_2$), Nitromethane ($CH_3NO_2$), Nitrourea ($CH_3N_3O_3$), Thioformamide ($CH_3NS$), Thiourea ($CH_4N_2S$), Urea ($CH_4N_2O$), Acetaldehyde Ammonia ($C_2H_7NO$), Acetaldoxime ($C_2H_5NO$), Acetamide ($C_2H_5NO$), Ammonium Acetate ($C_2H_7NO_2$), Ammonium Thiocyanate ($C_2H_4N_2S$), Ethanolamine ($C_2H_7NO$), Glycine ($C_2H_5NO_2$), Methyl Carbamate ($C_2H_5NO_2$), N-Methylformamide ($C_2H_5NO$), Nitroethane ($C_2H_5NO_2$), N-Nitrosodimethylamine ($C_2H_6N_2O$), Thioacetamide ($C_2H_5NS$), Alanine ($C_3H_7NO_2$), 2-Aminopropanol ($C_3H_9NO$), 2,3-Diatninopropionic Acid ($C_3H_8N_2O_2$), NN-Dimethyformamide ($C_3H_7NO$), N,N'-Dimethylthiourea ($C_3H_8N_2S$), N-Ethyl-N-nitrosourea ($C_3H_7N_3O_2$), 1-Nitropropane ($C_3H_7NO_2$), Propionamide ($C_3H_7NO$), Trimethylamine ($C_3H_9N$), Urethan ($C_3H_7NO_2$), Alloxan ($C_4H_2N_2O_4$), 1-[(2-Aminoethyl)amino]-2-propanol ($C_5H_{14}N_2O$), Orotic Acid ($C_5H_4N_2O_4$), Schradan ($C_8H_{24}N_4O_3P_2$), Acetamidine Hydrochloride ($C_2H_7ClN_2$), Carbamyl Chloride ($CH_2ClNO$), Chloral Ammonia ($C_2H_4Cl_3NO$), Chloral Betaine ($C_7H_{14}Cl_3NO_4$), Chloral Formanide ($C_3H_4Cl_3NO_2$), Chloroacetamide ($C_2H_4ClNO$), 6-Chloropurine ($C_5H_3ClN_4$), N-Chlorosuccinimide ($C_4H_4ClNO_2$), Clonitrate ($C_3H_5ClN_2O_6$), Gibbs Reagent ($C_6H_2Cl_3NO$), Niclosamide ($C_{13}H_8Cl_2N_2O_4$) Sernicarbazide Hydrochloride ($CH_6ClN_3O$), Trichlorourethan ($C_3H_4Cl_3NO_2$), Urea Hydrochloride ($CH_5ClN_2O$) and the like and mixtures thereof It is also within the scope of the inventions to use other compounds that have a charge separated resonance structure with the above ureas or thioureas or in place of the ureas or thioureas. These include amphoterics such as vinyl ethers, e.g. ethyl vinyl ether and bases such as 1,5-Diazabicyclo[5.4.0]undec-7-ene (DBU) and 1,5-Diazabicyclo[4.3.≈nonene-5-ene (DBN).

Below are examples of several vinyl ethers. Ether vinyl ethyl is represented by structure 16 and isopropenyl acetate by structure 17.

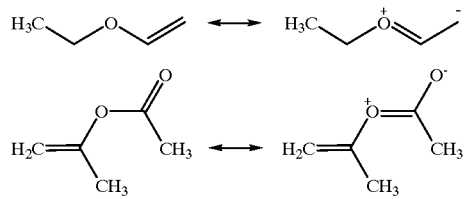

16      17

Bases that can be used have structures as follows:

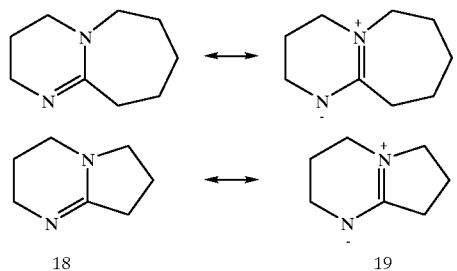

18      19

The top structure above 18 is DBU and the bottom structure is DBN. The resonance structures for DBU and DBN are represented by 19.

It may be possible to utilize a chlorinated or sulfur bearing compound which dissociates in solution to provide a free base containing the functional double bond amino-heteroatom resonance structure. This is demonstrated below with Ethanimidamide hydrochloride and (Aminoiminomethyl)urea sulfate:

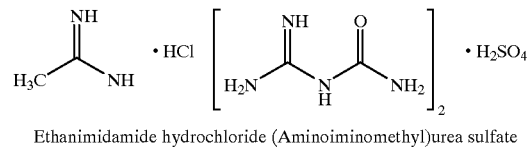

Ethanimidamide hydrochloride (Aminoiminomethyl)urea sulfate

The adhesive property of the priming composition of the present invention is believed to function primarily through the presence of an effective amount of component (d) having the resonance structure on a heteroatom compounds such as bis (hydroxymethyl) urea. It is believed that that this structure is the active mechanism by which adhesion is obtained through resonance shift of the double bond between the heteroatoms to an amine group. This creates a positive charge on the urea amine which then cross links to a compound in the photoresist. The negative charge created on the heteroatom, in turn, forms an ionic bond with the substrate. It should be noted that where the substrate is capable of absorbing the amine group, a bridge bond may be created between the substrate and the photoresist via the heteroatom-urea compound. The cleaning property of the present priming composition is believed to be the result of the resonance structure bonding to substrate contaminants, detergency, solvent action, surfactant and removal through processing rinse.

The following structures are representative of component (d) of the present priming compositions.

Structure (A) is bis(hydroxymethyl)urea and the resonance structure (B) which occurs:

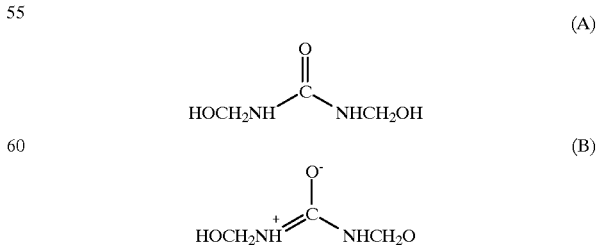

Similarly, this may occur in ethylene urea as shown by structure 1 and the resonance structure 2 when structure 1 is ethylene urea and the resonance structure 2 occurs when the non-bonding pair of electrons from one of the nitrogen's forms a bond between the carbon and nitrogen, forcing one of the bonding pairs of electrons between the carbon and oxygen onto the oxygen. Since electrons are negative, the deficiency of negative charge at the nitrogen is represented by a "+", sign and the excess negative charge at the oxygen is represented by a "−" sign.

When drawing such a resonance structure, the actual charge structure of the molecule is a mix of all possible resonance structures. For ethylene urea, there is a partial positive charge on the oxygen and partial positive charges on each nitrogen.

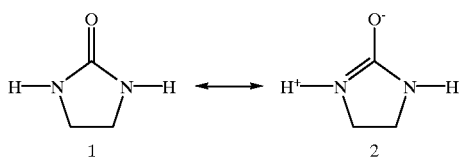

Since all significant heretoatoms (O, N, S, P, etc.) have at least one non-bonding pair of electrons, all can partake in resonance. Some examples of possible alternative compounds for ethylene urea are set forth by formulas (a) and (b) identified by structures 3, with the respective resonance structures 4. Note that structure "a" represents the known substitute, ethylene thiourea. Most imidazoles offer this resonance structure and can be possible substitutes.

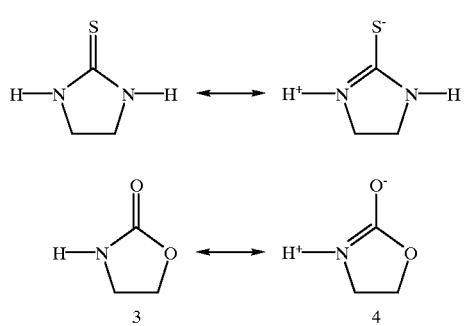

Other structure modifications that can be made on ethylene urea without altering the significant electronic structure include the following.

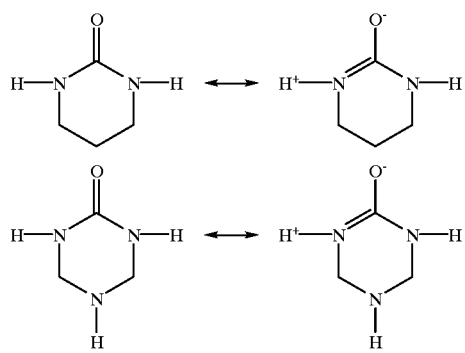

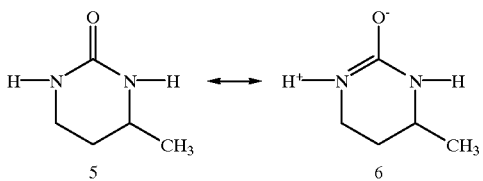

The priming composition of the invention can contain other non-essential compounds to facilitate preparation and application to a substrate. The priming composition can contain a non-ionic surfactant for wetting action and reducing surface tension, a detergency enhancer such as sodium sulfate or similar compounds, and an oxidizing agent such as sulfuric acid or other oxidizing agent as an accelerant at the substrate interface. The above materials can be added either before or after dilution of the priming composition concentrate.

The priming composition of the invention comprises, as essential components, an effective amount of each of an alcohol (component a), an alcohol ether (component b), an organic or poly acid (component c) and a urea—or a thiourea-containing compound (component d) sufficient to form a priming composition that functions both as a cleaning and adhesion promoting composition for use with a photoresist and a substrate.

Generally, the priming composition, as a concentrate, comprises at least 1 vol % of component (a), at least 5 vol % of component (b), at least 1 vol % of component (c), and at least 5 vol % component (d) with the balance being water. Preferably, the concentrate comprises 1–5 vol % (a), 5–10 vol % (b), 1–5 vol % (c) and 5–10 vol % (d) and the balance water. The upper limit for each component can range up to 20–25 vol % although product performance is not necessarily improved significantly using amounts outside the preferred ranges. Also, it is not economical to use large amounts of each component.

The priming concentrate composition of the invention can be used as such to treat a surface of a substrate prior to application of a photoresist, but preferably is diluted with an aqueous medium, preferably water, prior to use. The concentrate can be diluted with up to 98 vol % of an aqueous medium, preferably with from 60–97 vol % an aqueous medium.

The priming composition of the invention whether used as a concentrate or in diluted form can be applied to a stationary or moving substrate to be coated with a photoresist in any known manner, for example, by spraying, brushing, immersing, or other known means.

In one embodiment the priming composition can be applied to a substrate by spin coating. The priming composition is applied by spraying, for example, to a rotating substrate, followed by rinsing the rotating substrate with water or other suitable diluent to remove contaminants and excess priming composition from the surface of the substrate. The substrate is dried by spinning the substrate and then a coat of photoresist is applied to a priming composition-coated side of the substrate.

In another embodiment the priming composition can be applied to a substrate by brush cleaning. According to this procedure, a side of a rotating or stationary substrate is cleaned by brushing and scrubbing the substrate in the presence of priming composition of the invention, followed by rinsing the brushed and scrubbed substrate with water or other diluent, dried, and then applying a coating of photoresist to the brushed and scrubbed substrate.

In a further embodiment, the priming composition can be applied to a substrate prior to coating the substrate with a photoresist by immersion in a vessel containing the priming composition. If desired, the priming composition can be agitated by mechanical, ultrasonic or megasonic (degas) or other suitable means during immersion of the substrate into the priming composition. After immersion, the substrate is rinsed with water or other diluent, dried and then the dried substrate is coated with a layer of photoresist.

The temperature obtained during applying the priming composition to the substrate is usually ambient although higher or lower temperatures, e.g. 20–55° C. can be used.

The amount of priming composition applied to a substrate is sufficient to provide a thin layer of the priming composition on a side of a substrate to be coated with photoresist. The resonance structure of component (d) of the priming component is believed to provide the active mechanism which allows for adhesion by bonding the oxygen group to the substrate and the nitrogen/hydrogen group to the photoresist. Also, the resonance structure of component (d) is thought be bond substrate contaminants which are removed during rinsing of the substrate with water following application of the priming composition of the substrate.

Substrates that can be used according to the invention include silicon, glass, indium tin oxide (ITO), gallium arsenate (GaAs) or other suitable substrates that provide a base for positive and negative photoresists. The substrate can be precleaned before application of the present priming composition, if desired, but it is not necessary.

A positive or negative photoresist can be applied to a substrate having a layer of the present priming composition in any manner known in the art and then subjected to photochemical treatment to cure and bond the photoresist to the substrate.

Photoresists used in optical media mastering generally comprise photo-active compounds combined in a resin media. This resin media typically consists of alkali-soluble terpene phenols reacted with an aldehyde and/or ketone in the presence of an acidic catalyst. The aldehyde is typically formaldehyde, p-formaldehyde, acetaldyhde, propylaldehyde, benzaldehyde, phenyl-acetaldehyde or furfural. The ketone is usually acetone or cyclohexanone. The final resist is applied to a substrate in a solvent media of ethylene glycol's or propylene glycol's, with propylene glycol monomethyl ether acetate preferred for its toxicological advantages.

The dominant photoresist in the compact disc industry is a product called Shipley 1800 series where the last two digits refer to the coating thickness in microns when applied by spin coating at 4000 rpm. Actual coating thickness appears to be irrelevant in relationship to the present invention as bonding is only required at the matrix interface in order to obtain the desire priming results. The Shipley 1800 series resist is comprised of the photo-active compounds and a cresol formaldehyde resin in a propylene glycol solvent.

The function of the heteroatoms resonance structure of component (d) of the invention priming composition is believed to be one where free electrons within phenol chains are bound by the urea derivative or otherwise functional equivalent. It should be noted that the invention does not work effectively with all resist, particularly those which utilize nitrocellulose based resins, but works extremely well with resists comprising phenol type resins.

Primers currently used with the above-described photoresists consist almost exclusively of silane ($SiH_4$) compounds. Of these, the predominant is hexamethyldisilane (HMDS), though other silanes including amino silanes are also used. This compound is believed to form a bridge bond between the photoresist and the substrate, cross-linking, to provide adhesion. HMDS is used either as a concentrate or diluted, though dilution is not recommended due to inconsistency in coating thickness. If diluted, the same solvent used in the resist is added to the silane.

Silanes are deposited either by vapor deposition in which a substrate is placed in a chamber where the silane is vaporized, or through spin coat application where the silane is dispensed onto a rotating substrate until coated, then spun dry.

A significant difference between the present invention and HMDS is tolerance to water. The presence of moisture between the substrate and the HMDS may result in adhesion failure. This problem is often addressed by baking the substrate for dehydration prior to application of the HMDS primer. It should be noted that there exist solvated silane primers which may be diluted with water. Unlike the invention, these primers are highly volatile and have a short shelf life.

As discussed above, the instant priming composition is a complete cleaning and adhesion promoting composition for use with photoresists on various substrates. The priming composition of the invention accomplishes the task of cleaning and adhesion or bond promoting through creating an ionic charge at the matrix interface which repels substrate contaminants while providing a hydrogen bond for the adhesion of subsequently applied photo-resists. The invention priming composition provides a number of advantages and the first real alternative to HMDS, silanes and metal oxide priming agents.

The present invention provides the following advantages over the compositions now employed in the art.

| Invention | Advantages |
| --- | --- |
| Surfactant Cleaning and Adhesion Promoted Within a Single Step | Faster process time. Cost savings with elimination of existing multi-step processing chemicals and their waste treatment |
| Increased Adhesive Qualities for Positive Photoresist | Reduces or eliminates micro-adhesion failures and associated jitter, block error rate and replication release patterns. Reduces delamination and undercutting in HF etch. |
| Non-Hazardous Formulation- | Eliminates personal hazards and waste treatment associated with volatile organic solvents and HMDS |
| Adaptable to Various Substrate Preparation Process- Aqueous Based- | No need for expensive retooling of existing process. Eliminates the need for dehydration bake, in most cases. Extended shelf life over volatile solvent based primers. |
| Ideal for Applications Where Substrates Are Recycled | Does not cross-link with the substrate. Adhesive bond is 100% reversible minimizing or eliminating mechanical polishing requirements in substrate recycling. |

EXAMPLES

Evaluations were carried out comparing the photoresist adhesion for a priming composition of the invention, HMDS (hexamethyldisilane) and a control group. The compositions were evaluated for the ability of each to provide both macro- and micro-adhesion of cresol formaldehyde to glass substrates.

The priming composition of the invention (XP) comprised a 3% solution of bis(hydroxymethyl) urea (7.5 g/L), glycolic acid (2.5 ml/L), diethylene glycol monomethyl ether (7.5 ml/L), ethylene glycol (2.5 ml/L), sodium sulfate (1.2 g/L), and the balance water.

Macro-adhesion describes the ability of the priming agent to reduce failure by environmental factors such as handling, temperature fluctuations, thermodynamics, compressive stress of the photoresist.

Micro-adhesion describes the ability of the priming agent to reduce delamination and undercutting of the photoresist at the matrix interface, as may occur during exposure to developing or etching solutions during processing.

Macro-Adhesion Evaluation:

Macro-adhesion was evaluated through visual examination of glass slides which were primed, coated with photoresist and exposed to ultrasonic agitation.

Study Test Groups:

1. Invention priming composition (XP): Glass slides were primed by immersion in XP priming agent, 30 seconds, then rinsed in DI water, 30 seconds. Primed slides were dried immediately after rinsing by spin dry, 500 rpm, for three minutes.

2. HMDS (hexamethyldisilane): Glass slides were vapor primed by enclosure in seal hood with open solution of HMDS for 30 minutes.

3. Control: No adhesion promoter was used.

Process Parameters:

1. Utilized Corning pre-cleaned microscope slides.

2. Slides were masked on one side for single surface coating of immersion processing, using sulfur-free vinyl tape.

3. Slide primed as described in "Study Test Groups".

4. Primed slides were coated in cresol formaldehyde type photoresist (Shipley Microposit 1805) by immersion for 15 seconds. Slides were spun dry at 500 rpm, 5 minutes, immediately after coating to provide uniform coating thickness.

5. Vinyl masking was removed and the slides were baked in a convection oven at 110° C. for 30 minutes.

6. Test groups were evaluated at five minute intervals for presence of photoresist after exposure to ultrasonic agitation, using DI water maintained at 50° C. This temperature was selected as this is the typical operating temperature of a sulfamate nickel electroforming bath which would be used for creating nickel compact disc master from recorded photoresist. Slides were tested one at a time with placement in identical positions to reduce variability of ultrasonic field exposure.

7. To reduce variability, batch processing was used in all spin dry and baking operations.

Evaluation of Macro-Adhesion:

Test slides were evaluated after each 5 minute interval of exposure to ultrasonic agitation. Presence of photoresist was evaluated by placing the slide against a template divided into 5×13–4 millimeter cells and observing under ultraviolet light. Cells showing significant loss of adhesion, or absence of greater than 20% of the photoresist, were counted as a failure of that cell. The template configuration disregarded any failure within 4 mm of the edge of the slide as edge failure may be the result of delamination and undercutting.

Results:

Results are graphed in FIG. 1 as percent failure by time interval for each test group. The invention product (XP) shows a significant reduction in adhesion failure over both the control group and HMDS.

Micro-Adhesion Evaluation:

Micro-adhesion, or the ability of the priming agent to reduce delamination and undercutting of developing and etching solutions.

Study Test Groups:

1. Silicon oxide substrate vapor primed with HMDS.

2. Silicon oxide substrate spin coated with invention priming composition (XP). Substrate rinsed with DI water at 2000 rpm for 30 seconds, adhesion promoter dispensed on spinning substrate for 30 seconds at 2000 rpm, then rinsed again with DI water. Primed substrate was dried using light nitrogen flow.

Processing Parameters:

1. Primed substrates were coated with photoresist to obtained coating of 4500 angstroms.

2. Coated substrate were baked at 170° C. for 40 minutes in a convection oven.

3. Test groups were exposed to 100 KeV electron beam, dose: 600 $\mu C/cm^2$.

4. Exposed resist was developed in solution of MIBK/IPA 1:2, 50 second immersion.

5. Coated, exposed and developed test groups etched in solutions of hydrofluoric acid (HF).

Figure 2:
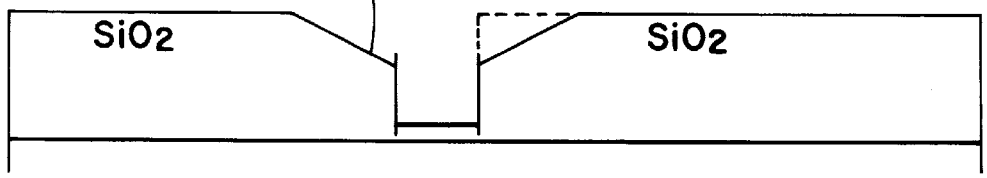
FIG. 2 is a sectional view of an etched substrate surface, shown after photoresist delamination and subsequent exposure to HF.

6. Etch substrates cross-sectioned and observed under SEM for extent of delamination, as shown in FIG. 2.

Results:

The invention priming composition (XP) showed the same degree of delamination from an etching solution of 10% HF, 20 seconds, as occurred on a substrate primed with HMDS and exposed to a 1% solution of HF for 15 seconds.

I claim:

1. A priming concentrate composition suitable as a priming composition for cleaning a substrate and promoting adhesion of a photoresist to the substrate, said priming composition comprising:

(a) at least 1 vol % of an alcohol, (b) at least 5 vol % of an alcohol ether, (c) at least 1 vol % of an organic acid, poly acid, acid anhydride, or acid halide thereof, and (d) at least 5 vol % of a urea or thiourea or derivative or analogue thereof having a resonance structure that functions to bond to both a substrate and a photoresist.

2. A priming concentrate composition according to claim 1 comprising 1–5 vol % (a), 5–10 vol % (b), 1–5 vol % (c) and 5–10 vol % (d) and the balance water.

3. A priming concentrate composition according to claim 1 wherein (c) is a hydroxy mono- or dicarboxylic organic acid and (d) is a hydroxy or alkyl derivative of urea or thiourea.

4. A priming concentrate composition suitable as a priming composition for cleaning a substrate and promoting adhesion of a photoresist to the substrate, said priming composition comprising:

(a) a dihydroxy alcohol, (b) an alkyl ether of ethylene glycol, (c) a monohydroxy monocarboxylic organic acid or a dihydroxy dicarboxylic organic acid, and (d) a monohydroxy or polyhydroxy derivative of urea or thiourea.

5. A priming concentrate composition according to claim 4 wherein (b) comprises a monoalkyl ether of diethylene glycol.

6. A priming concentrate composition according to claim 5 wherein (a) is ethylene glycol, (b) is diethylene glycol monomethyl ether, (c) is glycolic acid and (d) is bis(hydroxymethyl) urea.

7. A priming concentrate composition according to claim 6 further comprising an effective amount of at least one non-essential component selected from non-ionic surfactants, a detergency enhancer, and an oxidizing agent.

8. A priming concentrate composition according to claim 7 further comprising 1–5 vol % sodium sulfate as the detergency enhancer.

9. A cleaning and adhesive promoting priming composition comprising the concentrate of claim 4 diluted with 60 to 98 vol % of an aqueous medium.

10. A composition according to claim 9, wherein the aqueous medium is water.

11. A priming concentrate composition suitable as a priming composition for cleaning a substrate and promoting adhesion of a photoresist to the substrate, comprising (a) at least 1 vol % of an alcohol, (b) at least 5 vol % of an alcohol ether, (c) at least 1 vol % of an organic acid, poly acid, acid anhydride, or acid halide thereof, (d) at least 5 vol % of a urea or thiourea or derivative or analogue thereof having a resonance structure that functions to bond to both a substrate and a photoresist, wherein said composition is formulated to permit a double bond between an amine moiety and heteroatom of (d) to undergo resonance shift to create a positive charge on the amine moiety and a negative charge on the heteroatom, thereby promoting adhesion of the photoresist to the substrate.

12. A priming concentrate composition according to claim 11 comprising 1–5 vol % (a), 5–10 vol % (b), 1–5 vol % (c) and 5–10 vol % (d) and the balance water.

13. A priming concentrate composition according to claim 11 wherein (c) comprises a hydroxy mono- or dicarboxylic organic acid and (d) comprises a hydroxy or alkyl derivative of urea or thiourea.

14. A priming concentrate composition suitable as a priming composition for cleaning a substrate and promoting adhesion of a photoresist to the substrate, comprising (a) a dihydroxy alcohol, (b) an alkyl ether of ethylene glycol, (c) a monohydroxy mono-carboxylic organic acid or a dihydroxy dicarboxylic organic acid and (d) a monohydroxy or polyhydroxy derivative of urea or thiourea having a resonance structure that functions to bond to both a substrate and a photoresist, wherein said composition is formulated to permit a double bond between an amine moiety and heteroatom of (d) to undergo resonance shift to create a positive charge on the amine moiety and a negative charge on the heteroatom, thereby promoting adhesion of the photoresist to the substrate.

15. A priming concentrate composition according to claim 14 wherein (b) comprises a monoalkyl ether of diethylene glycol.

16. A priming concentrate composition according to claim 15 wherein (a) comprises ethylene glycol, (b) comprises diethylene glycol monomethyl ether, (c) comprises glycolic acid and (d) comprises bis(hydroxymethyl) urea.

17. A priming concentrate composition according to claim 16 further comprising an effective amount of at least one non-essential component selected from non-ionic surfactants, a detergency enhancer, and an oxidizing agent.

18. A priming concentrate composition according to claim 17 further comprising 1–5 vol % sodium sulfate as the detergency enhancer.

* * * * *